United States Patent
Ooishi et al.

(10) Patent No.: US 9,385,512 B2
(45) Date of Patent: Jul. 5, 2016

(54) ELECTRICAL JUNCTION BOX WITH ELECTRICAL COMPONENTS MOUNTED TO CONDUCTIVE METAL PLATES ACROSS A GAP

(75) Inventors: Manabu Ooishi, Kakegawa (JP); Maki Sugiura, Kakegawa (JP); Kazuhiro Yamamoto, Kakegawa (JP); Kenji Ogawa, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 158 days.

(21) Appl. No.: 13/878,460

(22) PCT Filed: Oct. 20, 2011

(86) PCT No.: PCT/JP2011/074739
§ 371 (c)(1),
(2), (4) Date: Apr. 9, 2013

(87) PCT Pub. No.: WO2012/053664
PCT Pub. Date: Apr. 26, 2012

(65) Prior Publication Data
US 2013/0194725 A1  Aug. 1, 2013

(30) Foreign Application Priority Data
Oct. 20, 2010  (JP) .................................. 2010-235152

(51) Int. Cl.
*H02B 1/01*  (2006.01)
*H05K 1/02*  (2006.01)
(Continued)

(52) U.S. Cl.
CPC .............. *H02B 1/012* (2013.01); *H05K 1/0203* (2013.01); *H05K 1/056* (2013.01); *H05K 7/026* (2013.01); *H05K 3/3447* (2013.01); *H05K 3/44* (2013.01); *H05K 2201/09663* (2013.01)

(58) Field of Classification Search
CPC .... H05K 3/4641; H05K 7/026; H05K 3/3447
USPC .......... 174/250, 255, 520; 361/622, 795, 600, 361/752, 761; 439/76.2
See application file for complete search history.

(56) References Cited

U.S. PATENT DOCUMENTS 4,208,080 A * 6/1980 Teagno ................ H01R 12/523
29/830
5,410,107 A * 4/1995 Schaper .............. H01L 23/5383
174/255
(Continued)

FOREIGN PATENT DOCUMENTS

DE  20 2005 019 094 U1  5/2006
JP  08-288606 A  11/1996
(Continued)

OTHER PUBLICATIONS

Notification of Reason for Refusal mailed Jul. 29, 2014, issued for the corresponding Japanese patent application No. 2010-235152 and English translation thereof.

(Continued)

*Primary Examiner* — Courtney Smith
*Assistant Examiner* — Jessey R Ervin
(74) *Attorney, Agent, or Firm* — Locke Lord LLP; James E. Armstrong, IV; Brian S. Matross

(57) ABSTRACT

An electrical junction box for distributing electric power in a vehicle includes a metal core substrate provided with a core metal assembly having two core metal plates arranged with a gap, an insulating layer embedded in the gap and covering surfaces of the core metal plates to integrate the core metal plates, and electronic components. Electric power from a battery is inputted into the core metal plate, and electric power from an alternator is inputted into the core metal plate. The electronic components are provided with a plurality of attaching portions soldered or screwed to the metal core substrate. At least one of the attaching portions is attached to the core metal plate, and at least one of the attaching portions is attached to the core metal plate.

3 Claims, 5 Drawing Sheets

(51) Int. Cl.
   *H05K 1/05*   (2006.01)
   *H05K 7/02*   (2006.01)
   *H05K 3/34*   (2006.01)
   *H05K 3/44*   (2006.01)

(56) References Cited

U.S. PATENT DOCUMENTS

| | | | | |
|---|---|---|---|---|
| 5,510,758 | A * | 4/1996 | Fujita | H01L 24/17 257/728 |
| 5,777,851 | A * | 7/1998 | Yamamoto | 361/748 |
| 7,074,053 | B2 * | 7/2006 | Kawakita | H01R 12/716 174/520 |
| 7,428,155 | B2 * | 9/2008 | Nakao | H05K 1/0225 361/792 |
| 7,505,283 | B2 * | 3/2009 | Naimi | H05K 3/0064 174/50 |
| 7,667,979 | B2 * | 2/2010 | Yun | H01M 10/425 174/250 |
| 2002/0096357 | A1 * | 7/2002 | Iwasaki | H01L 23/49838 174/250 |
| 2005/0257957 | A1 * | 11/2005 | Vasoya | H05K 3/445 174/260 |
| 2007/0158105 | A1 * | 7/2007 | Kitao | H05K 1/162 174/261 |
| 2007/0279871 | A1 | 12/2007 | Ishida et al. | |
| 2011/0088928 | A1 * | 4/2011 | Lim | H05K 1/0262 174/252 |
| 2011/0139489 | A1 * | 6/2011 | Yoon | H05K 1/0227 174/250 |

FOREIGN PATENT DOCUMENTS

| | | |
|---|---|---|
| JP | 2006-333583 A | 12/2006 |
| JP | 2007-325345 A | 12/2007 |

OTHER PUBLICATIONS

International Search Report mailed Jun. 18, 2012, issued for PCT/JP2011/074739.

* cited by examiner

ELECTRICAL JUNCTION BOX WITH ELECTRICAL COMPONENTS MOUNTED TO CONDUCTIVE METAL PLATES ACROSS A GAP

TECHNICAL FIELD

This invention relates to an electrical junction box mounted on a vehicle, in particular, the electrical junction box to distribute electric power using a metal core substrate.

BACKGROUND ART

Various electronic devices are mounted on a vehicle. For distributing the electric power to the various electronic devices, an electrical junction box is arranged at a proper position in the vehicle. Depending on a car type, electrical junction boxes having various structures are used. For example, like an electrical junction box disclosed in Patent Document 1, there is an electrical junction box for distributing electric power using a metal core substrate.

Further, as shown in FIG. 7, an electrical junction box 510 using a core metal plate 502 of a metal core substrate 501 for not only radiation but also a part of an electric power distributing circuit is known. This electrical junction box 510 distributes electric power from a battery and an alternator to a plurality of electronic devices, and includes: one metal core substrate 501; a plurality of electronic components mounted on a surface of the metal core substrate 501; a connector 507a connected to the battery; a connector 507b connected to the alternator; and a not-shown case receiving them.

The metal core substrate 501 is provided with one core metal plate 502; insulating layers 504a, 504b covering a surface of the core metal plate 502; and conductor patterns 505 formed on the insulating layers 504a, 504b. Further, the conductor patterns 505 are made of copper foil.

The connector 507a is composed of an L-shaped terminal 571a and a connector housing 570a. The terminal 571a is provided with a first connecting portion 572a connected to a connector of a wiring harness connected to the battery, and a second connecting portion 573a attached to the metal core substrate 501. The first connecting portion 572a is disposed on an inside of the connector housing 570a. The second connecting portion 573a is attached to the metal core substrate 501 in a manner penetrating the metal core substrate 501, electrically connected to the conductor patterns 505, and isolated from the core metal plate 502.

The connector 507b is composed of an L-shaped terminal 571b and a connector housing 570b. The terminal 571b is provided with a first connecting portion 572b connected to a connector of a wiring harness connected to the alternator, and a second connecting portion 573b attached to the metal core substrate 501. The first connecting portion 572b is disposed on an inside of the connector housing 570b. The second connecting portion 573b is attached to the metal core substrate 501 in a manner penetrating the metal core substrate 501, and electrically connected to the conductor patterns 505 and the core metal plate 502.

In this way, in the electrical junction box 510, an electric power distribution circuit from the battery is only composed of the conductor patterns 505 formed on surfaces of the insulating layers 504a, 504b, and an electric power distribution circuit from the alternator is composed of the conductor patterns 505 and the core metal plate 502. However, in the electric power distribution circuit from the battery, because a thickness of the conductor patterns 505 is thinner than that of the core metal plate 502, the conductor patterns 505 need a large surface area, thereby there is a problem that the metal core substrate 501 becomes upsized.

In view of this problem, as an electrical junction box 610 shown in FIG. 8, a straight slit is formed on a core metal plate 602 to split the core metal plate 602, and one split portion 602a is used as the electric power distribution circuit from the battery, and the other split portion 602b is used as the electric power distribution circuit from the alternator. Thereby, the metal core substrate 601 is prevented from being upsized.

Further, reference signs 604a, 604b in FIG. 8 denote insulating layers for being embedded in the slit 603, and covering a surface of the core metal plate 602 to integrate the split core metal plate portions. Further, reference sign 605 in FIG. 8 denotes conductor patterns formed on the insulating layers 604a, 604b. Further, reference sign 570a in FIG. 8 denotes a connector connected to the battery similar to FIG. 7. Reference sign 570b denotes a connector connected to the alternator similar to FIG. 7.

PRIOR ART DOCUMENT

Patent Document

Patent Document 1: JP, A, 2007-325345

DISCLOSURE OF THE INVENTION

Problem to be Solved by the Invention

However, as the electrical junction box 610 shown in FIG. 8, when the core metal plate 602 is simply split by forming the straight slit 603 on the core metal plate 602, the weight of the electronic components mounted on the metal core substrate 601 and the weight of the metal core substrate 601 acts on the slit 603 which has lower strength than the other parts, and there is a problem that the metal core substrate 601 may be bent as shown in FIG. 9.

Accordingly, an object of the present invention is to provide an electrical junction box able to prevent a metal core substrate from being upsized, and to prevent the metal core substrate from being bent.

Means for Solving the Problem

For attaining the object, according to the invention claimed in claim 1, there is provided an electrical junction box for respectively distributing inputted electric power from power sources of a plurality of systems to a plurality of metal core plates comprising:

a metal core substrate provided with a core metal assembly having the core metal plates arranged with slit-shaped gaps, and an insulating layer embedded in the gaps and covering surfaces of the metal core plates to integrate the metal core plates; and electronic components mounted on the metal core substrate, wherein the electronic components are provided with a plurality of attaching portions soldered or screwed to the metal core substrate, and wherein at least one of the attaching portions is soldered or screwed to one of the cone metal plates adjacent to each other with the gap therebetween, and at least one of the attaching portions is soldered or screwed to the other one of the core metal plates adjacent to each other with the gap therebetween.

According to the invention claimed in claim 2, there is provided the electrical junction box as claimed in claim 1, wherein the core metal assembly is formed in a rectangular shape, and wherein the gap at least includes: a first straight portion extended straight from one side of the rectangular shape; and a second straight portion extended from the other side of the rectangular shape, parallel to a virtual extension line of the first straight portion, and not arranged in alignment with the first straight portion.

According to the invention claimed in claim 3, there is provided the electrical junction box as claimed in claim 1 or 2, wherein one of the core metal plates adjacent to each other with the gap therebetween is provided with a convex projected toward the other core metal plate, and the other core metal plate is provided with a concave where the convex is positioned.

Effects of the Invention

According to the invention claimed in claim 1, the plurality of core metal plates are used as electric power distribution circuits of the power sources of the plurality of systems, thereby the metal core substrate is prevented from being upsized. Further, at least one of the attaching portion is soldered or screwed to one of the cone metal plates adjacent to each other with the gap therebetween, and at least one of the attaching portions is soldered or screwed to the other one of the core metal plates adjacent to each other with the gap therebetween. Therefore, by soldering or screwing the attached portions, the strength of the metal core substrate is reinforced, thereby the metal core substrate is prevented from being bent along the gap. Accordingly, the electrical junction box able to prevent the metal core substrate from being upsized, and to prevent the metal core substrate from being bent can be provided.

According to the invention claimed in claim 2, the core metal plate is formed in a rectangular shape, and the gap at least includes: a first straight portion extended straight from one side of the rectangular shape; and a second straight portion parallel to a virtual extension line of the first straight portion, and not arranged in alignment with the first straight portion. Therefore, in comparison with a case that the gap is straight, low strength portions are dispersed, thereby the metal core substrate is further prevented from being bent along the gap.

According to the invention claimed in claim 3, one of the core metal plates adjacent to each other with the gap therebetween is provided with a convex projected toward the other core metal plate, and the other core metal plate is provided with a concave where the convex is positioned. Therefore, in comparison with a case that the gap is straight, low strength portions are dispersed. Further, the length of the gap is increased, thereby quantity of resin for adhering the core metal plates to each other is increased. Therefore, the metal core substrate is further prevented from being bent along the gap.

DESCRIPTION OF EMBODIMENTS

First Embodiment

An electrical junction box according to a first embodiment of the present invention will be explained with reference to FIGS. 1 to 5.

Figure 1:
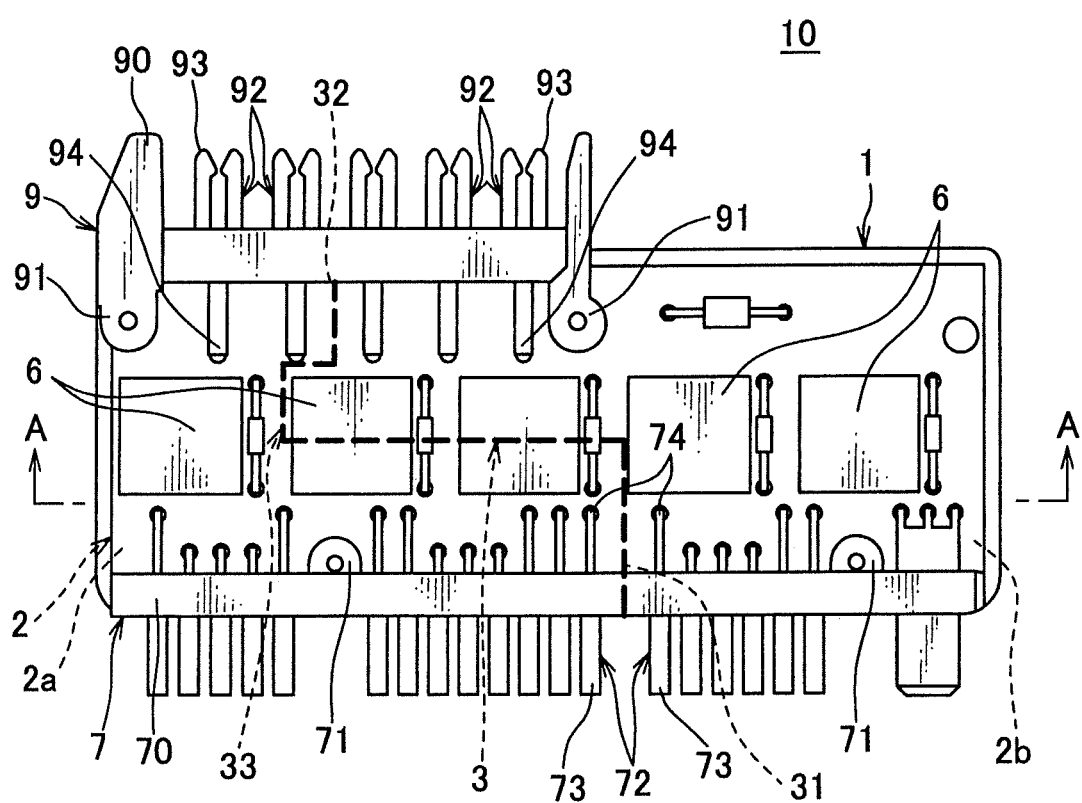
FIG. 1 A schematic plan view showing an electrical junction box according to a first embodiment of the present invention.
Figure 2:
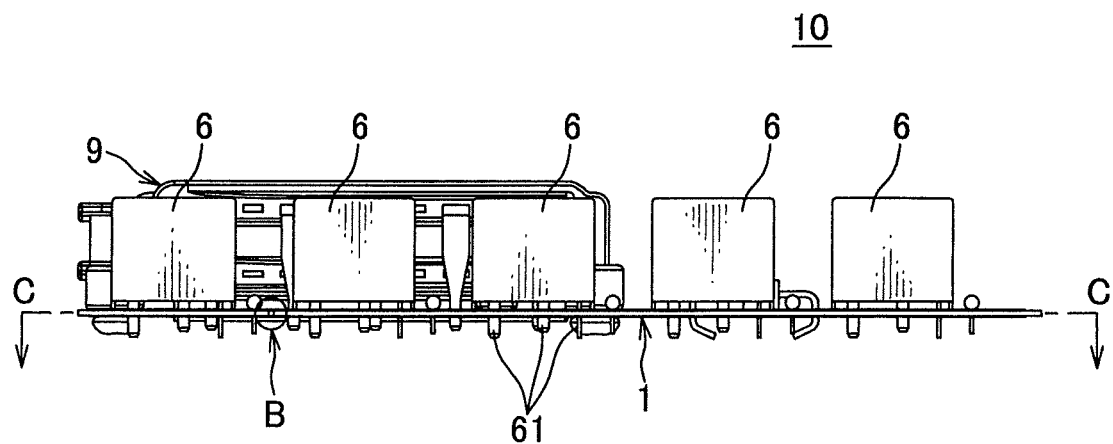
FIG. 2 A sectional view taken on line A-A of FIG. 1.

An electrical junction box 10 of this embodiment is mounted on a vehicle and distributes electric power from a battery and an alternator to a plurality of electronic devices. As shown in FIGS. 1 and 2, this electrical junction box 10 includes: a piece of metal core substrate 1; a plurality of relays 6, connector blocks 7, and fuse blocks 9 mounted on a surface of the metal core substrate 1; and a not-shown case receiving them. Further, the relay 6, the connector block 7, the fuse block 9 correspond to the electronic components described in claims.

Figure 3:
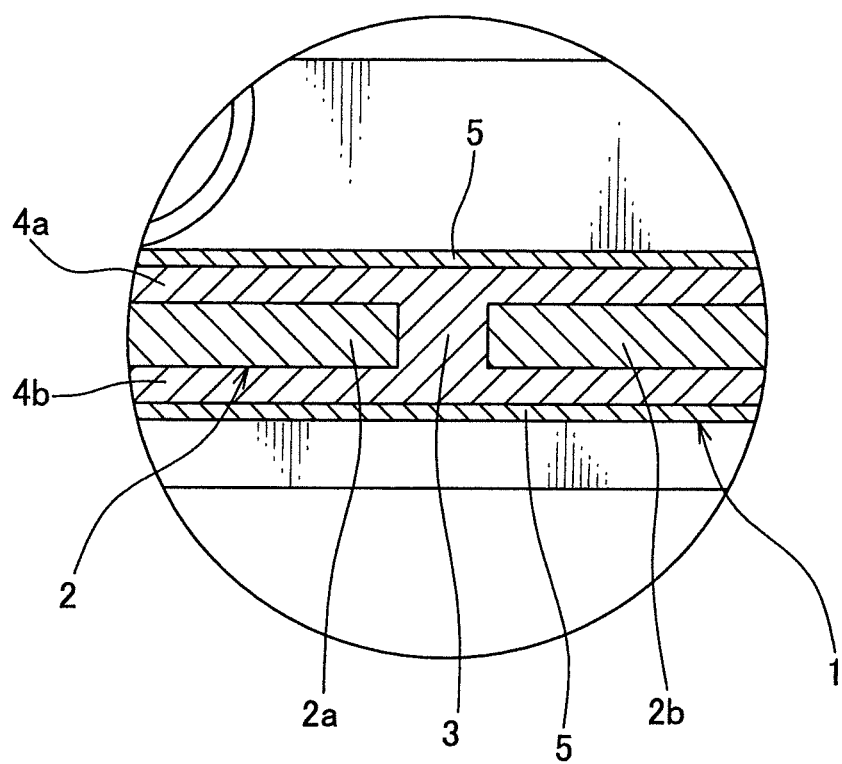
FIG. 3 An enlarged view of B portion of FIG. 2.
Figure 4:
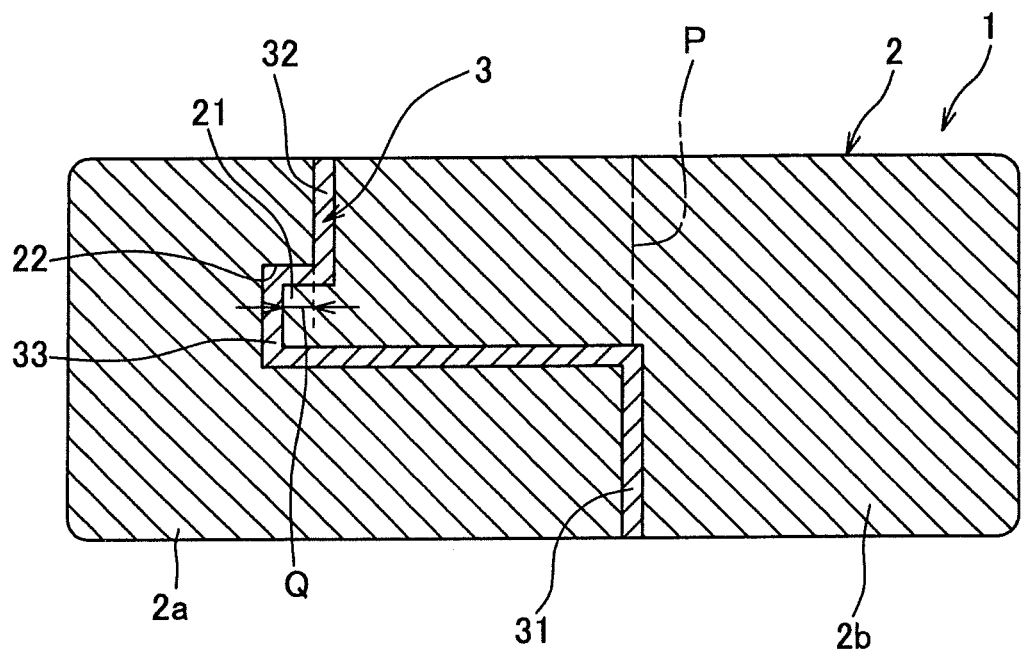
FIG. 4 A sectional view taken on line C-C of FIG. 2.

As shown in FIGS. 3 and 4, the metal core substrate 1 is provided with a core metal assembly 2 having a rectangular shape in a plan view on which two core metal plates 2a, 2b are arranged in the same plane having a gap 3 between the core metal plates 2a, 2b, insulating layers 4a, 4b embedded in the gap 3 and covering surfaces of the two core metal plates 2a, 2b to integrate the core metal plates 2a, 2b, conductor patterns 5 formed on surfaces of the insulating layers 4a, 4b, and a plurality of not-shown through-holes. The insulating layers 4a, 4b are composed of prepreg material made by impregnating a fiberglass textile with epoxy resin. Namely, epoxy resin is filled and hardened in the gap 3. The conductor patterns 5 are made of copper foil.

As shown in FIG. 2, the relay 6 is provided with a plurality of terminals 61 inserted into the through-holes of the metal core substrate 1 and soldered. The terminals 61 correspond to the attaching portions described in claims.

As shown in FIG. 1, the connector block 7 is composed of a housing 70 made of synthetic resin, and a plurality of L-shaped terminals 72 held in this housing 70. The housing 70 is provided with a pair of screw fixing portions 71 screwed to the metal core substrate 1. The terminal 72 is provided with a first connecting portion 73 connected to a mating connector, and a second connecting portion 74 inserted into the through-hole of the metal core substrate 1 and soldered. The second connecting portion 74 corresponds to the attaching portion described in claims. This connector block 7 is connected to a connector of a wiring harness connected to the battery, a connector of a wiring harness connected to the alternator, and connectors of the other wiring harnesses.

As shown in FIG. 1, the fuse block 9 is composed of a housing 90 made of synthetic resin, and a plurality of L-shaped terminals 92 held in this housing 90. The housing 90 is provided with a pair of screw fixing portions 91 screwed to the metal core substrate 1. The terminal 92 is provided with a first connecting portion 93 connected to a fuse, and a second connecting portion 94 inserted into the through-hole of the metal core substrate 1 and soldered. The second connecting portion 94 corresponds to the attaching portion described in claims.

The electrical junction box 10 like this separates the electric power inputted into the one core metal plate 2a from the battery via the wiring harness and the connector block 7 into the conductor patterns 5, the relay 6, the fuse block 9, and the like, and distributes the electric power to the electronic devices. Further, the electrical junction box 10 separates the electric power inputted into the other core metal plate 2b from the alternator via the wiring harness and the connector block 7 into the conductor patterns 5, the relay 6, the fuse block 9, and the like, and distributes the electric power to the electronic devices.

Thus, according to the present invention, the two core metal plates 2a, 2b are used not only as radiators, but also as a part of electric power distributing circuit, thereby the metal core substrate 1 is prevented from being upsized.

Further, for preventing the metal core substrate 1 from being bent by the weight of the relay 6, the connector block 7, the fuse block 9, and the like, and the weight of the metal core substrate 1 acting on the gap 3 which has lower strength than the other parts, the electrical junction box 10 of the present invention adopts a strength improvement structure which will be explained below.

As a first strength improvement structure, according to the present invention, as shown in FIG. 1, the plurality of relays 6 are disposed so as to step over the gap 3. Further, at least one of the plurality of terminals 61 of the relays 6 is soldered to the one core metal plate 2a, and the other terminals 61 are soldered to the other core metal plate 2b.

As a second strength improvement structure, according to the present invention, as shown in FIG. 1, the connector block 7 is disposed so as to step over the gap 3. Further, one of the pair of screw fixing portions 71 of the connector block 7 is screwed to the one core metal plate 2a, and the other screw fixing portion 71 is screwed to the other core metal plate 2b. Further, the plurality of terminals 72 of the connector block 7 are soldered to the one core metal plate 2a, and the other terminals 72 of the connector block 7 are soldered to the other core metal plate 2b.

As a third strength improvement structure, according to the present invention, as shown in FIG. 1, the fuse block 9 is disposed so as to step over the gap 3. Further, one of the pair of screw fixing portions 91 of the fuse block 9 is screwed to the one core metal plate 2a, and the other screw fixing portion 91 is screwed to the other core metal plate 2b. Further, the plurality of terminals 92 of the fuse block 9 are soldered to the one core metal plate 2a, and the other terminals 92 of the fuse block 9 are soldered to the other core metal plate 2b.

As a fourth strength improvement structure, according to the present invention, as shown in FIGS. 1 and 4, the gap 3 is not a straight line. Namely, the gap 3 includes: a first straight portion 31 extended straight from one side of the rectangular core metal assembly 2; a second straight portion 32 extended straight from an opposite side of the core metal assembly 2, parallel to a virtual extension line P of the first straight portion 31, and not arranged in alignment with the first straight portion 31; and a substantially U-shaped portion 33 connecting both ends of the first straight portion 31 and the second straight portion 32. A width of this gap 3 is 0.5 to 1.0 mm. Further, two core metal plates 2a, 2b are arranged adjacent to each other having the gap 3 between them. The other core metal plate 2b is provided with a convex 21 projected toward the one core metal plate 2a. The one core metal plate 2a is provided with a convex 22 where the convex 21 is positioned. A projecting length Q of the convex 21 from the second straight portion 32 is more than 10 mm.

According to the fourth strength improvement structure, because the gap 3 is not straight, in comparison with a case that the gap 3 is straight, low strength portions are dispersed, thereby the metal core substrate 1 is prevented from being bent along the gap 3. Further, because the first straight portion 31 and the second straight portion 32 are not arranged in alignment with each other, the metal core substrate 1 is prevented from being bent along the first straight portion 31 and the second straight portion 32. Further, because the gap 3 is formed in a zigzag shape, in comparison with a case that the gap 3 is straight, low strength portions are dispersed, and a length of the gap 3 is longer, thereby quantity of resin for adhering the core metal plates 2a, 2b to each other is increased. Therefore, the metal core substrate 1 is prevented from being bent along the gap 3.

Further, according to the present invention, because the projecting length Q of the convex 21 from the second straight portion 32 is more than 10 mm, the metal core substrate 1 is prevented from being deformed.

Figure 5:
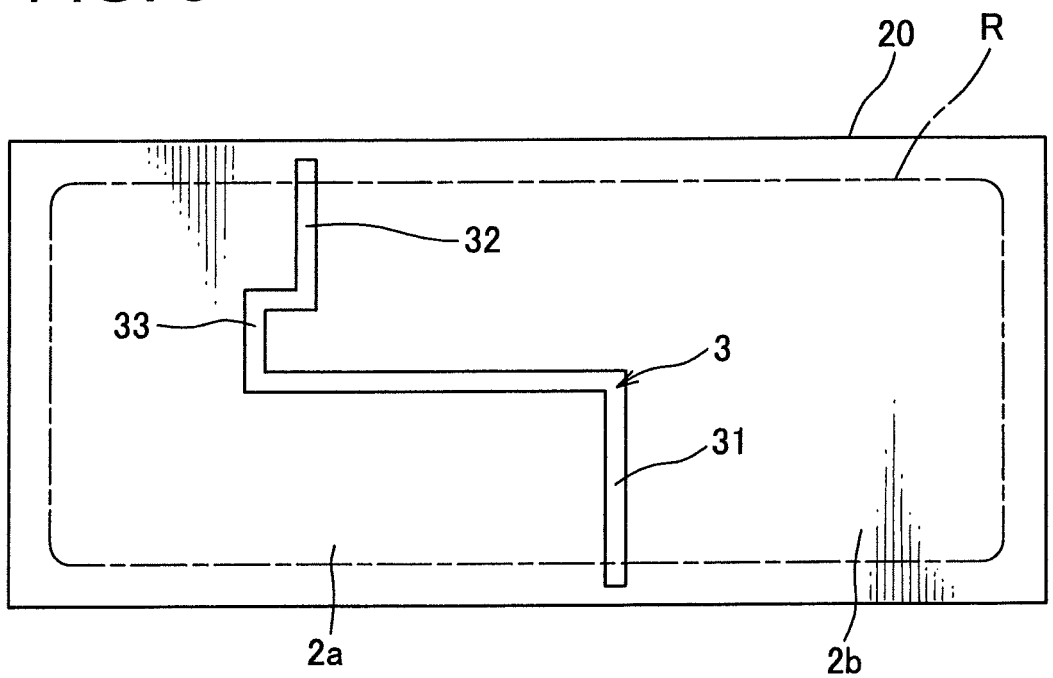
FIG. 5 An explanatory view explaining a production method of a metal core substrate shown in FIG. 4.

The core metal plates 2a, 2b are made from a sheet of metal plate 20 shown in FIG. 5. Namely, the metal core substrate 1 is made by punching the metal plate 20 to form a gap, laminating prepreg material on front and back surfaces of the metal plate 20, and cutting off an outer part of a chain line R in the metal plate 20.

Thus, according to the present invention, the electrical junction box 10 able to prevent the metal core substrate 1 from being upsized, and to prevent the metal core substrate 1 from being bent can be provided.

Second Embodiment

An electrical junction box according to a second embodiment of the present invention will be explained with reference to FIG. 6. Further, in FIG. 6, the same components as the first embodiment are indicated by the same reference signs, and an explanation thereof is omitted.

The electrical junction box of this embodiment is mounted on a vehicle, and distributes electric power from three power sources, namely, a battery, a first alternator, and a second alternator to a plurality of electronic devices. This electrical junction box includes: a sheet of metal core substrate 101 shown in FIG. 6; a plurality of relays, connector blocks, and fuse blocks mounted on a surface of the metal core substrate 101; and a not-shown case receiving them.

Figure 6:
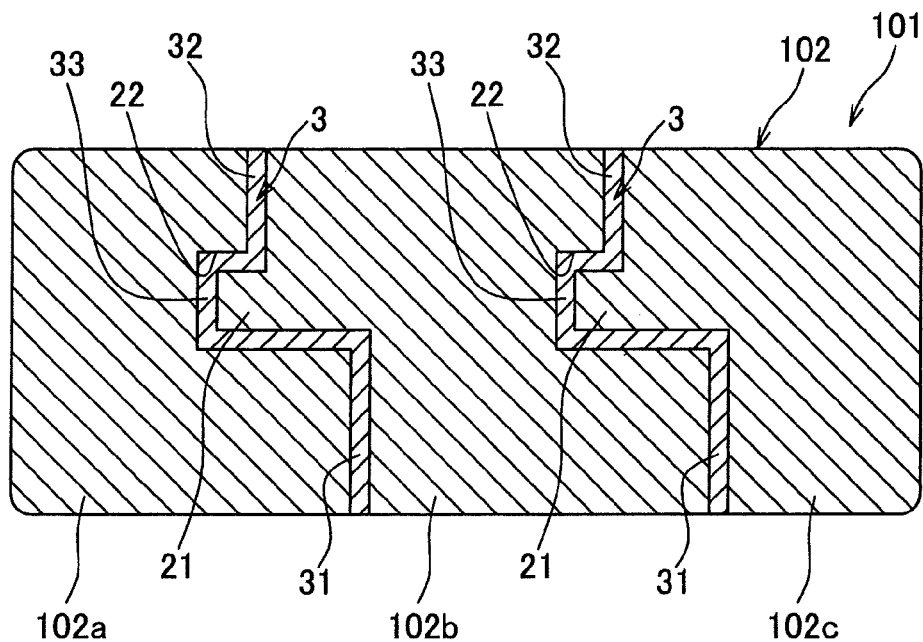
FIG. 6 A sectional view showing a metal core substrate as a component of the electrical junction box according to a second embodiment of the present invention.
Figure 7:
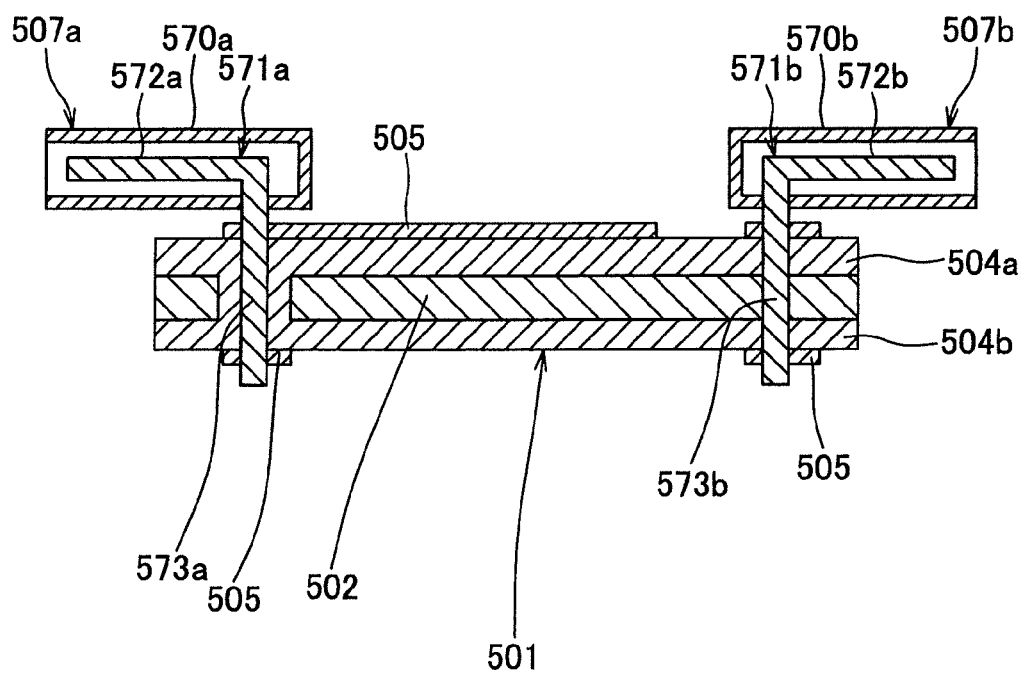
FIG. 7 A schematic sectional view showing a conventional electrical junction box.
Figure 8:
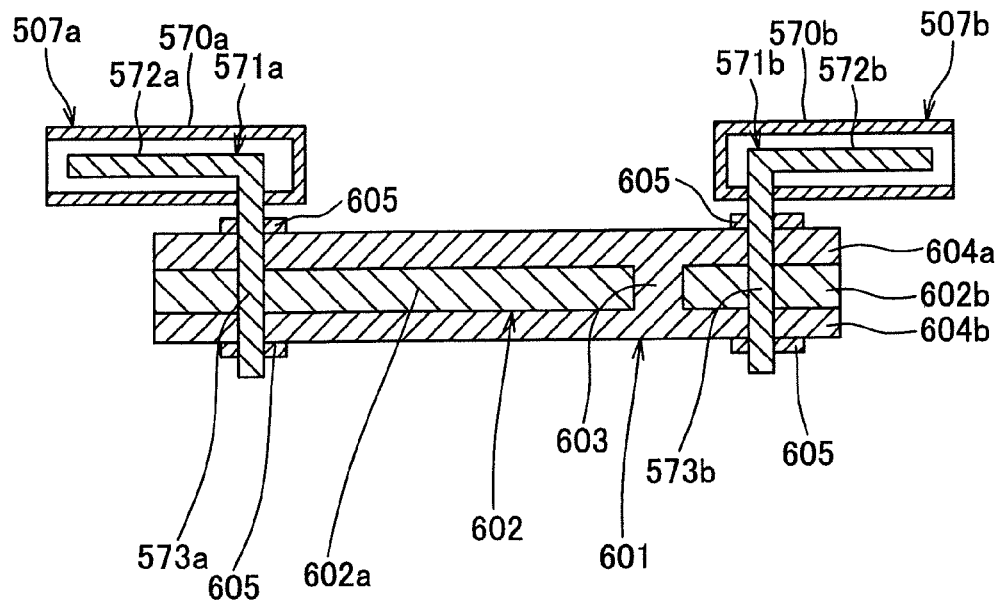
FIG. 8 A schematic sectional view showing another conventional electrical junction box.
Figure 9:
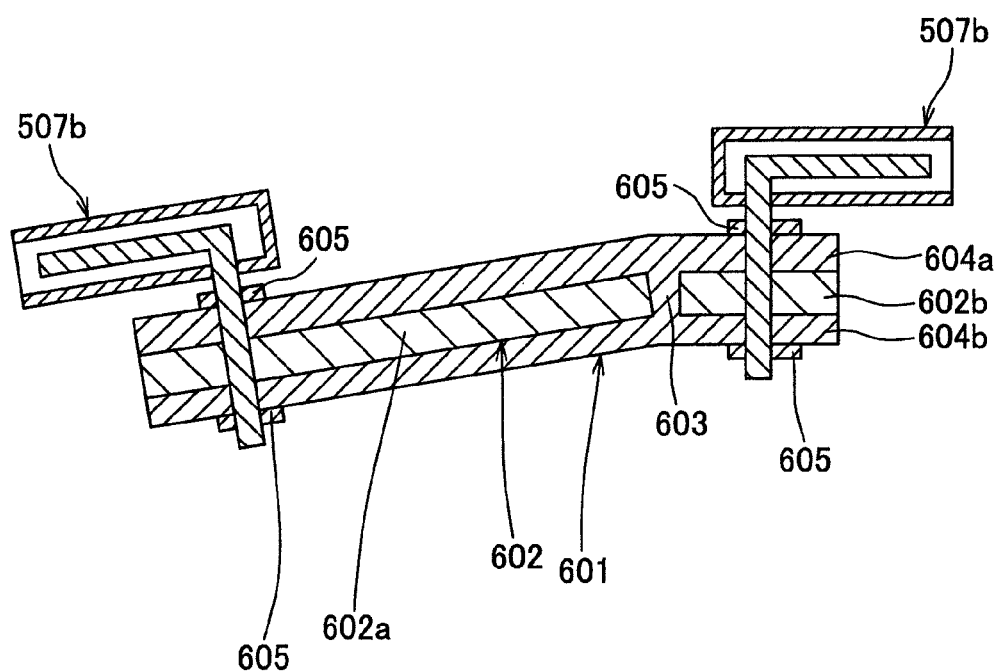
FIG. 9 A sectional view showing a condition that the metal core substrate of FIG. 8 is deformed.

As shown in FIG. 6, the metal core substrate 101 is provided with a core metal assembly 102 having a rectangular shape in a plan view on which three core metal plates 102a, 102b, 102c are arranged in the same plane via two slit-shaped gaps 3, insulating layers (not shown) embedded in the gaps 3 and covering surfaces of the three metal core plates 102a, 102b, 102c to integrate the metal core plates 102a, 102b, 102c, conductor patterns (not shown) formed on the insulating layers, and a plurality of not-shown through-holes. The insulating layers are the same constitution as the insulating layers 4a, 4b explained in the first embodiment.

The electrical junction box of this embodiment separates the electric power inputted into the three core metal plates 102a, 102b, 102c from the three power sources via the wiring harness and the connector blocks into the conductor patterns, the relays, the fuse blocks, and the like, and distributes the electric power to the electronic devices.

In this way, according to the present invention, the core metal assembly 102 may be composed of a plurality of gaps 3, and not less than three pieces of core metal plates 102a, 102b, 102c.

Further, though a detailed explanation is omitted, in the electrical junction box of this embodiment, similar to the electrical junction box 10 of the first embodiment, the relays, the connector blocks, the fuse blocks are disposed so as to step over the gaps 3, at least one of the plurality of attaching portions of the relays and the like are soldered or screwed to one of the core metal plates 102a, 102b or one of the core metal plates 102b, 102c adjacent to each other having the gap 3 therebetween, and the other attaching portions are soldered or screwed to the other of the core metal plates 102a, 102b or the other of the core metal plates 102b, 102c adjacent to each other having the gap 3 therebetween.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

REFERENCE SIGNS LIST

1, 101 metal core substrate
2, 102 core metal assembly
2a, 2b, 102a, 102b, 102c core metal plate
3 gap
4a, 4b insulating layer
6 relay (electronic component)
7 connector block (electronic component)
9 fuse block (electronic component)
10 electrical junction box
21 convex
22 concave
31 first straight portion
32 second straight portion
61 terminal (attaching portion)
71, 91 screw fixing portion (attaching portion)
74, 94 second connecting portion (attaching portion)
P vertical extension line

The invention claimed is:

1. An electrical junction box for respectively distributing inputted electric power from power sources of a plurality of systems to a plurality of core metal plates comprising:

a metal core substrate provided with a rectangular shaped core metal assembly having the core metal plates arranged with slit-shaped gaps connected end to end to one another across the substrate, and an insulating layer embedded in the gaps and covering surfaces of the core metal plates to integrate the core metal plates; and a plurality of electronic components mounted on the metal core substrate, including a connector block mounted along one longitudinal edge of the substrate and a fuse block mounted along an opposite longitudinal edge of the substrate, wherein the electronic components are provided with a plurality of attaching portions soldered or screwed to the metal core substrate, wherein at least one of the attaching portions of the electronic components is a pair of screw fixing portions arranged on a housing which is made of synthetic resin and constitutes the electronic components, wherein the pair of screw fixing portions are screwed to one and an other of the plurality of core metal plates adjacent to each other at opposite ends of the fuse block with the gap therebetween, respectively, and wherein the slit-shaped gaps include a first straight portion extending from the connector block longitudinally offset from the fuse block, and a second straight portion extending from fuse block.

2. The electrical junction box as claimed in claim 1, wherein one of the core metal plates adjacent to each other with the gap therebetween is provided with a convex portion projected toward the other core metal plate, and the other core metal plate is provided with a concave portion where the convex portion is positioned.

3. The electrical junction box as claimed in claim 1, wherein one of the core metal plates adjacent to each other with the gap therebetween is provided with a convex projected toward the other core metal plate, and the other core metal plate is provided with a concave where the convex is positioned.

* * * * *